United States Patent
Huai et al.

(10) Patent No.: US 7,233,039 B2
(45) Date of Patent: Jun. 19, 2007

(54) SPIN TRANSFER MAGNETIC ELEMENTS WITH SPIN DEPOLARIZATION LAYERS

(75) Inventors: Yiming Huai, Pleasanton, CA (US); Paul P. Nguyen, San Jose, CA (US)

(73) Assignee: Grandis, Inc., Milpitas, CA (US)

( * ) Notice: Subject to any disclaimer, the term of this patent is extended or adjusted under 35 U.S.C. 154(b) by 328 days.

(21) Appl. No.: 10/829,313

(22) Filed: Apr. 21, 2004

(65) Prior Publication Data

US 2005/0237787 A1     Oct. 27, 2005

(51) Int. Cl.
    *H01L 29/76* (2006.01)
(52) U.S. Cl. ................................. 257/295; 257/421
(58) Field of Classification Search ................ 257/295, 257/296, 421
    See application file for complete search history.

(56) References Cited

U.S. PATENT DOCUMENTS

| | | | |
|---|---|---|---|
| 6,532,164 | B2 | 3/2003 | Redon et al. |
| 6,809,909 | B2 * | 10/2004 | Hou et al. ............ 360/324.11 |
| 2002/0105827 | A1 | 8/2002 | Redon et al. |
| 2003/0007398 | A1 | 1/2003 | Daughton et al. |
| 2003/0059588 | A1 | 3/2003 | Hannah et al. |

OTHER PUBLICATIONS

J.F. Albert, et al, "Polarized Current Switching of a CO Thin Film Nanomagnet", American Institute of Physics, vol. 77, No. 23, Dec. 4, 2000, pp. 3809-3811.
J.A. Katine, et al, "Current-Driven Magnetization Reversal and Spin-Wave Excitations in Co/Cu/Co Pillars", the American Physical Society, vol. 84, No. 14, Apr. 3, 2000, pp. 3149-3151.
E.G. Myers, et al, "Point-Contact Studies of Current-Controlled Domain Switching in Magnetic Multilayers" Journal of Applied Physics, vol. 87, No. 9, May 1, 2000, pp. 5502-5503.
J.C. Slonczewski, "Theory and Application of Exchange-Driven Switching", IEEE, Apr. 2000, pp. CE-02.
J.C. Slonczewski, "Current-Driven Excitation of Magnetic Multilayers", Journal of Magnetism and Magnetic Materials, 1996, pp. 1.1-1.7.
J.C. Slonczewski, "Conductance and Exchange Coupling of Two Ferromagnets Separated by a Tunneling Barrier", The American Physical Society, vol. 39, No. 10, Apr. 1, 1999, pp. 6995-7002.
J.Z. Sun, "Current-Driven Magnetic Switching in Manganite Trilayer Junctions", Journal of Magnetism and Magnetic Materials, No. 202, 1999, pp. 157-162.
N.C. Emley, et al., *Reduction of spin transfer by synthetic antiferromagnets*, http://www.citebase.org/cgi-bin/fulltext?format=application/pdf&identifier=oal:arXiv.org:cond-mat/0401483, Jan. 2004.
L. Berger, *Emission of spin waves by a magnetic multilayer traversed by a current*, Physical Review B, vol. 54, No. 13, Oct. 1996, pp. 9353-9358.

* cited by examiner

*Primary Examiner*—Doug Menz
(74) *Attorney, Agent, or Firm*—Strategic Patent Group, P.C.

(57) ABSTRACT

A method and system for providing a magnetic element is disclosed. The method and system include providing a free layer, a spacer layer, and a pinned layer. The free layer is ferromagnetic and has a free layer magnetization. The spacer layer is nonmagnetic and resides between the pinned and free layers. The pinned layer includes first and second ferromagnetic layers having first and second magnetizations, a nonmagnetic spacer layer, and a spin depolarization layer. Residing between the first and second ferromagnetic layers, the nonmagnetic spacer layer is conductive and promotes antiparallel orientations between the first and second magnetizations. The spin depolarization layer is configured to depolarize at least a portion of a plurality of electrons passing through it. The magnetic element is also configured to allow the free layer magnetization to change direction due to spin transfer when a write current is passed through the magnetic element.

21 Claims, 7 Drawing Sheets

SPIN TRANSFER MAGNETIC ELEMENTS WITH SPIN DEPOLARIZATION LAYERS

FIELD OF THE INVENTION

The present invention relates to magnetic memory systems, and more particularly to a method and system for providing an improved magnetic element that employs a spin transfer effect in switching.

BACKGROUND OF THE INVENTION

Figure 1A:
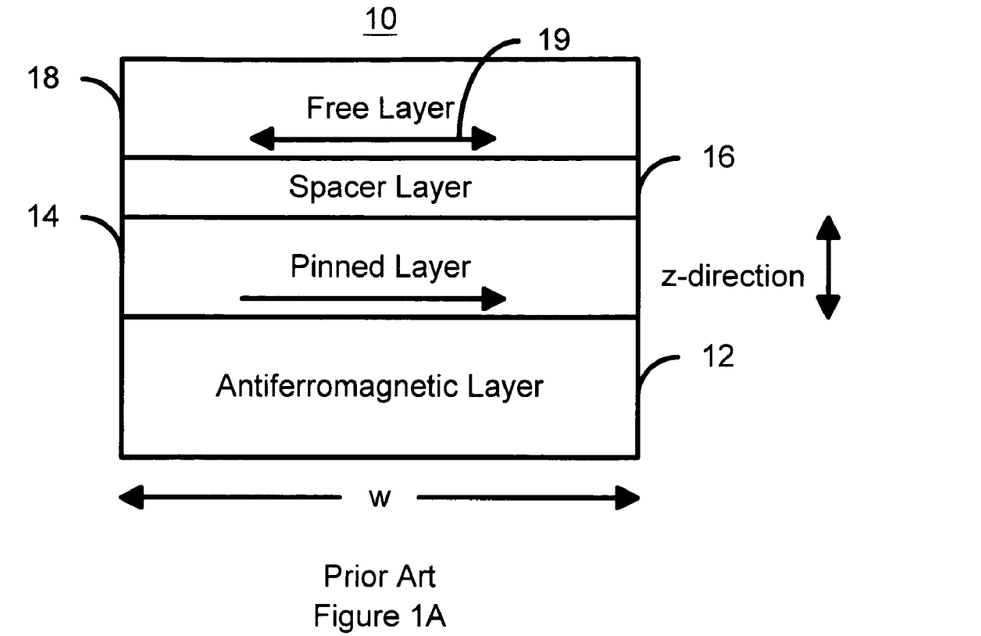
FIG. 1A is a diagram of a conventional magnetic element, a spin valve.
Figure 1B:
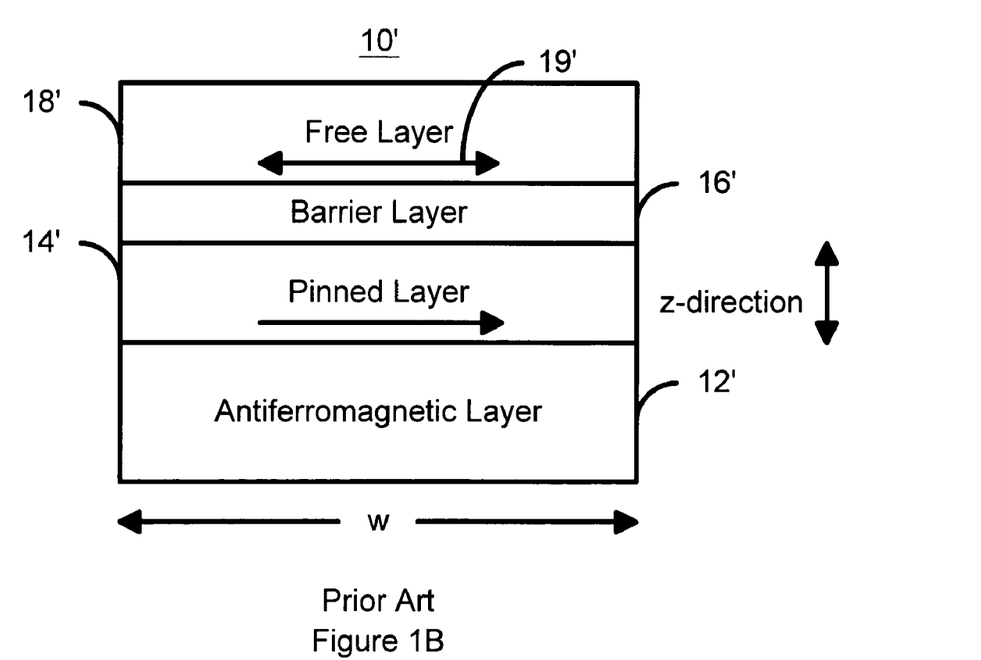
FIG. 1B is a diagram of another conventional magnetic element, a spin tunneling junction.

FIGS. 1A and 1B depict conventional magnetic elements 10 and 10'. The conventional magnetic element 10 is a spin valve and includes a conventional antiferromagnetic (AFM) layer 12, a conventional pinned layer 14, a conventional conductive spacer layer 16 and a conventional free layer 18. Other layers (not shown), such as seed or capping layer may also be used. The conventional pinned layer 14 and the conventional free layer 18 are ferromagnetic. Thus, the conventional free layer 18 is depicted as having a changeable magnetization 19. The conventional conductive spacer layer 16 is nonmagnetic. The AFM layer 12 is used to fix, or pin, the magnetization of the pinned layer 14 in a particular direction. The magnetization of the free layer 18 is free to rotate, typically in response to an external magnetic field. The conventional magnetic element 10' depicted in FIG. 1B is a spin tunneling junction. Portions of the conventional spin tunneling junction 10' are analogous to the conventional spin valve 10. Thus, the conventional magnetic element 10' includes an AFM layer 12', a conventional pinned layer 14', a conventional insulating barrier layer 16' and a conventional free layer 18' having a changeable magnetization 19'. The conventional barrier layer 16' is thin enough for electrons to tunnel through in a conventional spin tunneling junction 10'.

Depending upon the orientations of the magnetization 19/19' of the conventional free layer 18/18' and the conventional pinned layer 14/14', respectively, the resistance of the conventional magnetic element 10/10', respectively, changes. When the magnetization 19/19' of the conventional free layer 18/18' is parallel to the magnetization of the conventional pinned layer 14/14', the resistance of the conventional magnetic element 10/10' is low. When the magnetization 19/19' of the conventional free layer 18/18' is antiparallel to the magnetization of the conventional pinned layer 14/14', the resistance of the conventional magnetic element 10/10' is high. To sense the resistance of the conventional magnetic element 10/10', current is driven through the conventional magnetic element 10/10'. Typically in memory applications, current is driven in a CPP (current perpendicular to the plane) configuration, perpendicular to the layers of conventional magnetic element 10/10' (up or down, as seen in FIG. 1A or 1B).

In order to overcome certain issues associated with magnetic memories having a higher density of memory cells, spin transfer may be utilized to switch the magnetizations 19/19' of the conventional free layers 10/10'. Spin transfer is described in the context of the conventional magnetic element 10', but is equally applicable to the conventional magnetic element 10. Current knowledge of spin transfer is described in detail in the following publications: J. C. Slonczewski, "Current-driven Excitation of Magnetic Multilayers," *Journal of Magnetism and Magnetic Materials*, vol. 159, p. L1 (1996); L. Berger, "Emission of Spin Waves by a Magnetic Multilayer Traversed by a Current," *Phys. Rev. B*, vol. 54, p. 9353 (1996), and F. J. Albert, J. A. Katine and R. A. Buhrman, "Spin-polarized Current Switching of a Co Thin Film Nanomagnet," *Appl. Phys. Lett.*, vol. 77, No. 23, p. 3809 (2000). Thus, the following description of the spin transfer phenomenon is based upon current knowledge and is not intended to limit the scope of the invention.

When a spin-polarized current traverses a magnetic multilayer stack such as the spin tunneling junction 10' in a CPP configuration, a portion of the spin angular momentum of electrons incident on a ferromagnetic layer may be transferred to the ferromagnetic layer. In particular, electrons incident on the conventional free layer 18' may transfer a portion of their spin angular momentum to the conventional free layer 18'. As a result, a spin-polarized current can switch the direction of the magnetization 19' of the conventional free layer 18' if the current density is sufficiently high (approximately $10^7$–$10^8$ A/cm$^2$) and the conventional free layer 18' is sufficiently thin, for instance, preferably less than approximately ten nanometers for Co. Spin transfer-based switching of magnetization dominates over other switching mechanisms and becomes observable when the lateral dimensions of the conventional magnetic element 10/10' are small, in the range of few hundred nanometers. Consequently, spin transfer-based switching is suitable for higher density magnetic memories having smaller magnetic elements 10/10'.

The phenomenon of spin transfer can be used in the CPP configuration as an alternative to or in addition to using an external switching field to switch the direction of magnetization of the conventional free layer 18' of the conventional spin tunneling junction 10'. For example, the magnetization 19' of the conventional free layer 18' can be switched from antiparallel to parallel to the magnetization of the conventional pinned layer 14'. Current is driven from the conventional free layer 18' to the conventional pinned layer 14' (conduction electrons traveling from the conventional pinned layer 14' to the conventional free layer 18'). The majority electrons traveling from the conventional pinned layer 14' have their spins polarized in the same direction as the magnetization of the conventional pinned layer 14'. These electrons may transfer a sufficient portion of their angular momentum to the conventional free layer 18' to switch the magnetization 19' of the conventional free layer 18' to be parallel to that of the conventional pinned layer 14'. Alternatively, the magnetization of the free layer 18' can be switched from a direction parallel to antiparallel to the magnetization of the conventional pinned layer 14'. When current is driven from the conventional pinned layer 14' to the conventional free layer 18' (conduction electrons traveling in the opposite direction), the majority electrons have their spins polarized in the direction of magnetization of the conventional free layer 18'. These majority electrons are then transmitted through the conventional pinned layer 14'. The minority electrons, however, are reflected from the conventional pinned layer 14' to return to the conventional free layer 18' and may transfer a sufficient amount of their angular momentum to switch the magnetization 19' of the free layer 18' antiparallel to that of the conventional pinned layer 14'.

Although the spin transfer effect functions as a switching mechanism for the conventional magnetic elements 10 and 10', complications arise when synthetic antiferromagnetic structures, such as Co/Ru/Co, are used as pinned layers or free layers. In "Reduction of Spin Transfer by Synthetic Antiferromagnets," arXiv:cond-mat/0401483v1, 24 Jan. 2004, N. C. Emley, et al. observed significant reductions of the magnetoresistance ratio and of the spin transfer effect when they introduced synthetic antiferromagnetic structures into the pinned layers of their pseudo-spin valves. This reduction was attributed to the reduced polarization of the electrons passing through or being reflected from the synthetic antiferromagnetic structures for the common cases where the thicknesses of the sublayers in the synthetic antiferromagnetic structures are much smaller than the corresponding sublayers's spin diffusion lengths.

Accordingly, what is needed is a system and method for providing an improved magnetic element utilizing spin transfer as a switching mechanism. The present invention addresses such a need.

SUMMARY OF THE INVENTION

The present invention provides a method and system for providing a magnetic element. The method and system comprise providing a free layer, a spacer layer, and a pinned layer. The free layer is ferromagnetic and has a free layer magnetization. The spacer layer is nonmagnetic and the spacer layer resides between the pinned layer and the free layer. The pinned layer includes a first ferromagnetic layer having a first magnetization, a second ferromagnetic layer having a second magnetization, a nonmagnetic spacer layer, and a spin depolarization layer. The nonmagnetic spacer layer is conductive and resides between the first ferromagnetic layer and the second ferromagnetic layer. The nonmagnetic spacer layer is also configured such that the first magnetization and the second magnetization are antiparallel. The spin depolarization layer is configured to depolarize at least a portion of a plurality of electrons passing through it. The magnetic element is also configured to allow the free layer magnetization to change direction due to spin transfer when a write current is passed through the magnetic element.

DETAILED DESCRIPTION OF THE INVENTION

The present invention relates to an improvement in magnetic elements and magnetic memories, such as MRAM. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for providing a magnetic element. The method and system comprise providing a free layer, a spacer layer, and a pinned layer. The free layer is ferromagnetic and has a free layer magnetization. The spacer layer is nonmagnetic and the spacer layer resides between the pinned layer and the free layer. The pinned layer includes a first ferromagnetic layer having a first magnetization, a second ferromagnetic layer having a second magnetization, a nonmagnetic spacer layer, and a spin depolarization layer. The nonmagnetic spacer layer is conductive and resides between the first ferromagnetic layer and the second ferromagnetic layer. The nonmagnetic spacer layer is also configured such that the first magnetization and the second magnetization are antiparallel. The spin depolarization layer is configured to depolarize at least a portion of a plurality of electrons passing through it. The magnetic element is also configured to allow the free layer magnetization to change direction due to spin transfer when a write current is passed through the magnetic element.

The present invention will be described in terms of a particular magnetic element having certain components. However, one of ordinary skill in the art will readily recognize that this method and system will operate effectively for other magnetic memory elements having different and/or additional components having different and/or other features not inconsistent with the present invention. The present invention is also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. For example, as depicted in the drawings, the bottoms of the structures are typically closer to an underlying substrate than the tops of the structures. However, one of ordinary skill in the art will readily recognize that the method and system are consistent with other structures having different relationships to the substrate. In addition, the method and system are described in the context of certain layers being synthetic and/or simple. However, one of ordinary skill in the art will readily recognize that the layers could have another structure not inconsistent with the present invention. For example, although the method and system are described in the context of simple free layers, nothing prevents the present invention from being used with synthetic free layers. Furthermore, the present invention is described in the context of magnetic elements having particular layers. However, one of ordinary skill in the art will readily recognize that magnetic elements having additional and/or different layers not inconsistent with the present invention could also be used. Moreover, certain components are described as being ferromagnetic. However, as used herein, the term ferromagnetic could include ferrimagnetic or like structures. Thus, as used herein, the term "ferromagnetic" includes, but is not limited to ferromagnets and ferrimagnets. The present invention is also described in the context of single elements. However, one of ordinary skill in the art will readily recognize that the present invention is consistent with the use of magnetic memories having multiple elements, bit lines, and word lines.

Figure 2:
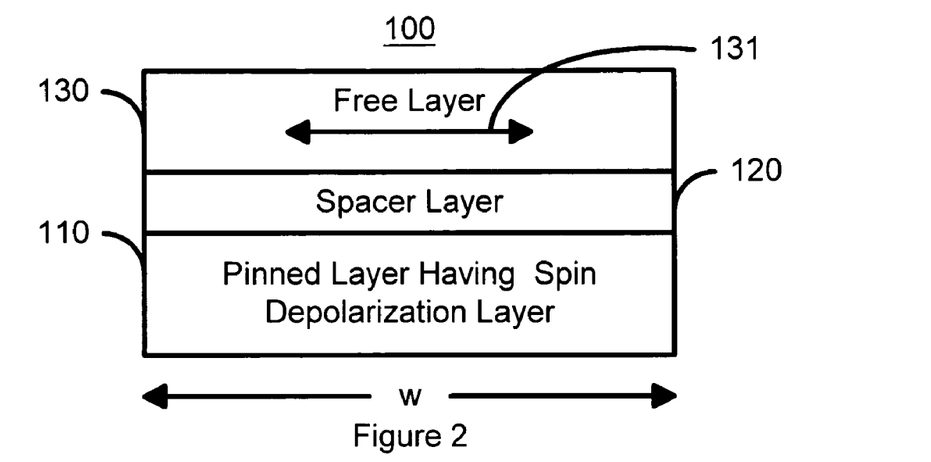
FIG. 2 depicts a first embodiment of a portion of a magnetic element in accordance with the present invention having a pinned layer with at least one spin depolarization sublayer.

To more particularly illustrate the method and system in accordance with the present invention, refer now to FIG. 2, depicting a first embodiment of a magnetic element 100 in accordance with the present invention having a synthetic antiferromagnetic pinned layer with at least one spin depolarization sublayer. The magnetic element 100 includes a free layer 130, a spacer layer 120, and a pinned layer 110 including at least one spin depolarization layer (SPDL). The magnetic element 100 generally also includes an AFM layer (not shown) used to pin the magnetization of the pinned layer 110, as well as seed layers (not shown) and capping layers (not shown). Furthermore, the magnetic element 100 is configured such that the free layer 130 can be written using spin transfer. Thus, the direction of the magnetization 131 of the free layer 130 can be switched using spin transfer. Consequently, in a preferred embodiment, the lateral dimensions, such as the width w, of the free layer 130 are thus small, in the range of a few hundred nanometers and preferably less than two hundred nanometers. In addition, some difference is preferably provided between the lateral dimensions to ensure that the free layer 130 has a particular easy axis in the plane of the free layer 130. In addition, the thickness of the second free layer 130 is preferably small enough that the spin transfer is strong enough to rotate the free layer magnetization into and out of alignment with the magnetization of the pinned layer 110. In a one embodiment, the free layer 130 has a thickness of less than five nm.

In one embodiment, the nonmagnetic spacer layer 120 is conductive, and preferably includes Ru. The spacer layer 120 can be conductive or can be an insulating barrier layer. If the spacer layer 120 is conductive, the magnetic element 100 corresponds to a spin valve. If the spacer layer 120 is an insulating barrier layer, then the magnetic element 100 corresponds to a magnetic tunneling junction. The nonmagnetic spacer layer is also configured such that the magnetizations of the ferromagnetic layers are aligned antiparallel. In one embodiment, the free layer 130 is a simple free layer, including a simple ferromagnetic layer. However, in an alternate embodiment, the free layer 130 may be a synthetic free layer including at least two ferromagnetic layers (not explicitly shown) separated by a conductive, nonmagnetic spacer layer such as Ru.

The pinned layer 110 is a synthetic antiferromagnetic pinned layer including at least two ferromagnetic layers (not explicitly shown) separated by a nonmagnetic spacer layer (not explicitly shown). Furthermore, as discussed above, the pinned layer 110 includes at least one SPDL configured to depolarize the spin angular momentums of electrons undergoing spin dependent scattering in at least one of the ferromagnetic layers of the pinned layer 110. Thus, the SPDL is configured to randomize the spins of charge carriers (i.e. electrons) traveling through the SPDL.

Figure 3A:
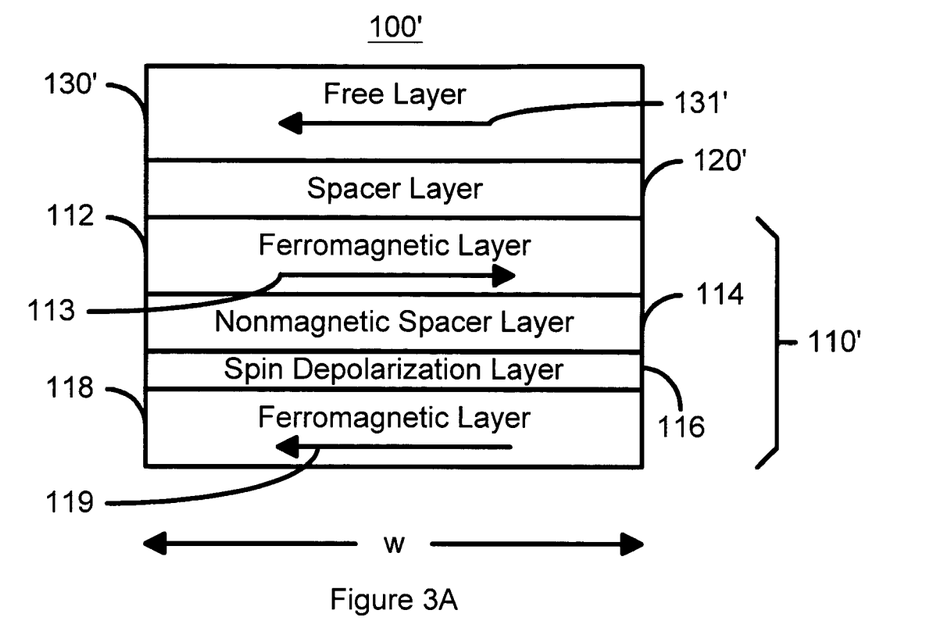
FIG. 3A depicts a first embodiment of a portion of a magnetic element in accordance with the present invention having a synthetic antiferromagnetic pinned layer with a spin depolarization sublayer.

To more particularly describe the pinned layer 110 having the SPDL, refer FIGS. 3A–3D. FIG. 3A depicts a first embodiment of a magnetic element 100' in accordance with the present invention having a synthetic antiferromagnetic pinned layer with at least one spin depolarization sublayer. The magnetic element 100' includes a pinned layer 110', a spacer layer 120' and a free layer 130'. The pinned layer 110', the spacer layer 120', and the free layer 130' correspond to the pinned layer 110, the spacer layer 120, and the free layer 130, respectively, depicted in FIG. 2. Referring back to FIG. 3A, the magnetic element 100' is also configured such that the free layer 130' can be written using spin transfer. Thus, the direction of the magnetization 131' of the free layer 130' can be switched using spin transfer. Consequently, in a preferred embodiment, the lateral dimensions, such as the width w, of the free layer 130' are small, in the range of a few hundred nanometers and preferably less than two hundred nanometers. In addition, some difference is preferably provided between the lateral dimensions to ensure that the free layer 130' has a particular easy axis in the plane of the free layer 130'. In addition, the thickness of the second free layer 130' may be small enough so that the spin transfer is sufficiently strong to rotate the free layer magnetization into and out of alignment with the magnetization of the pinned layer 110'. In one embodiment, the free layer 130' has a thickness of less than five nm.

The pinned layer 110' includes ferromagnetic layers 112 and 118 which are preferably composed of CoFe. However, in an alternate embodiment other ferromagnetic materials and/or alloys might be used. The pinned layer 110' also includes a nonmagnetic spacer layer 114 and a SPDL 116 between the nonmagnetic spacer layer 114 and the ferromagnetic layer 118. The ferromagnetic layers 112 and 118 are spaced apart such that their magnetizations 113 and 119, respectively, are antiferromagnetically aligned. The nonmagnetic spacer layer 114 is conductive and configured such that the magnetizations 113 and 119 of the ferromagnetic layers 112 and 118 are antiferromagnetically aligned. The SPDL 116 is configured to depolarize at least a portion of a plurality of electrons passing through it. Stated differently, the SPDL 116 is configured to randomize the spins of charge carriers (i.e. electrons) traveling through the SPDL 116. Consequently, the thickness, t, of the SPDL 116 is at least on the order of its spin diffusion. Moreover, the SPDL 116 is configured such that the coupling between the ferromagnetic layers 112 and 118 is not substantially adversely affected. As a result, the ferromagnetic layers 112 and 118 are still strongly antiferromagnetically coupled. In a preferred embodiment, the SPDL 116 includes PtMn, IrMn, CuMn, and/or CuPt. If CuMn is used, the portion of the SPDL 116 including CuMn is preferably two to eight atomic percent Mn. If CuPt is used, the portion of the SPDL 116 including CuPt is preferably two to eight atomic percent Pt. Also in a preferred embodiment, the SPDL 116 is between two and eight Angstroms thick. For a thickness of two through eight Angstroms and the materials listed above, the SPDL 116 can be deposited such that it is discontinuous. For the above materials, such a thickness is sufficient for the SPDL 116 to be as thick as the spin diffusion length of electrons and thin enough so that the ferromagnetic layers 112 and 118 remain strongly antiferromagnetically coupled.

As discussed above, when the magnetizations of the two ferromagnetic sublayers in a synthetic structure without an appropriate SPDL insertion are oriented antiparallel, the sublayers produce opposing effects on the spin current passing through or reflected from them, resulting in a weakened net effect. With the inclusion of the SPDL 116, the polarization of the spin current passing from the pinned layer to the free layer is determined primarily by the ferromagnetic layer 112, while the deleterious effects from the ferromagnetic layer 118 are reduced. Consequently, the spin transfer effect and magnetoresistance ratio are enhanced.

Figure 3B:
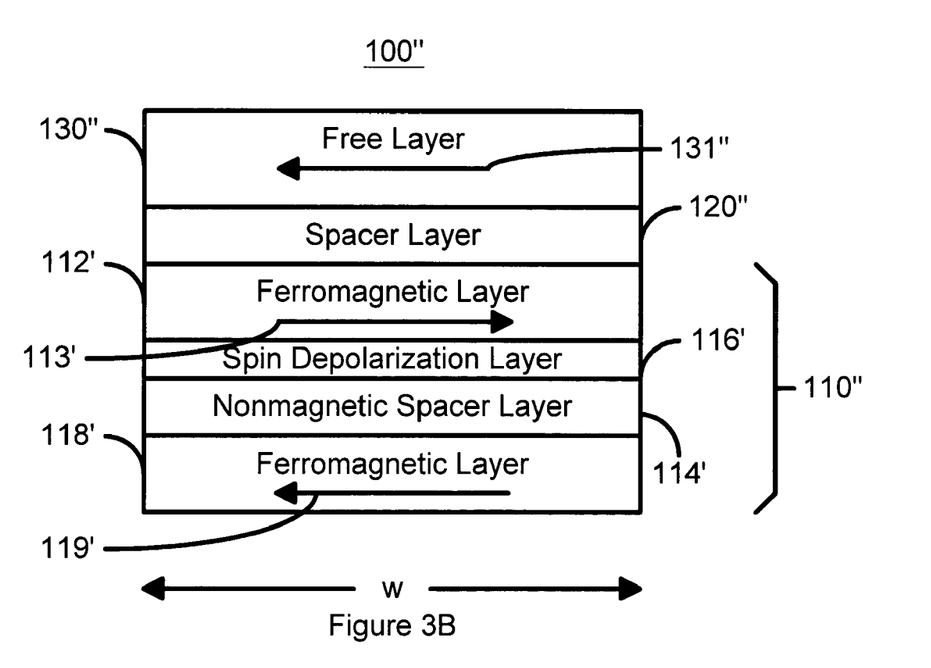
FIG. 3B depicts a second embodiment of a portion of a magnetic element in accordance with the present invention having a synthetic antiferromagnetic pinned layer with a spin depolarization sublayer.

FIG. 3B depicts a second embodiment of a magnetic element in accordance with the present invention having a synthetic antiferromagnetic pinned layer with at least one spin depolarization sublayer. The magnetic element 100" includes a pinned layer 110", a spacer layer 120" and a free layer 130". The spacer layer 120" and the free layer 130" correspond to the spacer layer 120 and the free layer 130 depicted in FIG. 2. Referring back to FIG. 3B, the magnetic element 100" is configured such that the free layer 130" can be written using spin transfer. Thus, the direction of the magnetization 131" of the free layer 130" can be switched using spin transfer. Consequently, in a preferred embodiment, the lateral dimensions, such as the width w, of the free layer 130" are thus small, in the range of a few hundred nanometers and preferably less than two hundred nanometers. In addition, some difference is preferably provided between the lateral dimensions to ensure that the free layer 130" has a particular easy axis in the plane of the free layer 130". In addition, the thickness of the second free layer 130" may be small enough so that the spin transfer is sufficiently strong to rotate the free layer magnetization into and out of alignment with the magnetization of the pinned layer 110". In one embodiment, the free layer 130" has a thickness of less than five nm.

The pinned layer 110" includes ferromagnetic layers 112' and 118' which are preferably composed of CoFe. However, in an alternate embodiment other ferromagnetic materials and/or alloys might be used. The pinned layer 110" also includes a nonmagnetic spacer layer 114' and a SPDL 116' between the nonmagnetic spacer layer 114' and the ferromagnetic layer 112'. The ferromagnetic layers 112' and 118' are spaced apart such that their magnetizations 113' and 119', respectively, are antiferromagnetically aligned. The nonmagnetic spacer layer 114' is conductive and configured such that the magnetizations 113' and 119' of the ferromagnetic layers 112' and 118' are antiferromagnetically aligned. The SPDL 116' is configured to depolarize at least a portion of a plurality of electrons passing through it. Stated differently, the SPDL 116' is configured to randomize the spins of charge carriers (i.e. electrons) traveling through the SPDL 116'. Consequently, the thickness, t, of the SPDL 116' is at least on the order of its spin diffusion length. Moreover, the SPDL 116' is configured such that the coupling between the ferromagnetic layers 112' and 118' is not substantially adversely affected. As a result, the ferromagnetic layers 112' and 118' are still strongly antiferromagnetically coupled. In a preferred embodiment, the SPDL 116' includes PtMn, IrMn, CuMn, and/or CuPt. If CuMn is used, the portion of the SPDL 116' including CuMn is preferably two to eight atomic percent Mn. If CuPt is used, the portion of the SPDL 116' including CuPt is preferably two to eight atomic percent Pt. Also in a preferred embodiment, the SPDL 116' is between two and eight Angstroms thick. For a thickness of two through eight Angstroms and the materials listed above, the SPDL 116' can be deposited such that it is discontinuous. For the above materials, such a thickness is sufficient for the SPDL 116' to be as thick as the spin diffusion length of electrons and thin enough so that the ferromagnetic layers 112' and 118' remain strongly antiferromagnetically coupled.

With the inclusion of the SPDL 116', the polarization of the spin current passing from the pinned layer to the free layer is determined primarily by the ferromagnetic layer 112', while the deleterious effects from the ferromagnetic layer 118' are reduced. Consequently, the spin transfer effect and magnetoresistance ratio are enhanced.

Figure 3C:
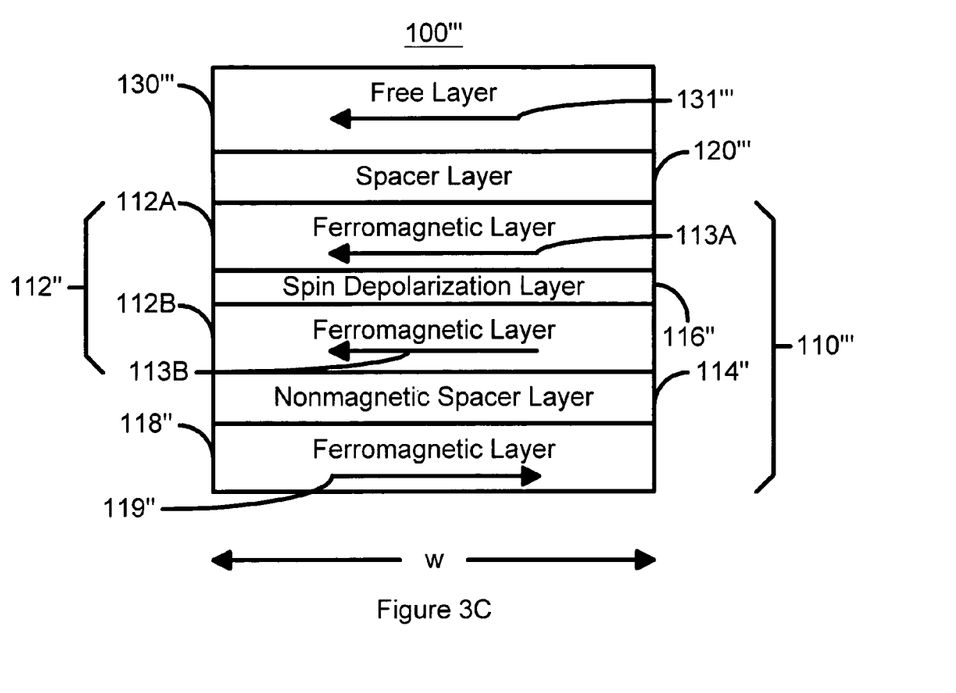
FIG. 3C depicts a third embodiment of a portion of a magnetic element in accordance with the present invention having a synthetic antiferromagnetic pinned layer with a spin depolarization sublayer.

FIG. 3C depicts a third embodiment of a magnetic element in accordance with the present invention having reduced reflected electrons having opposing torques due to reflection at different interfaces. The magnetic element 100''' includes a pinned layer 110''', a spacer layer 120''' and a free layer 130'''. The spacer layer 120''' and the free layer 130''' correspond to the spacer layer 120 and the free layer 130 depicted in FIG. 2. Referring back to FIG. 3C, the magnetic element 100''' is configured such that the free layer 130''' can be written using spin transfer. Thus, the direction of the magnetization 131''' of the free layer 130''' can be switched using spin transfer. Consequently, in a preferred embodiment, the lateral dimensions, such as the width w, of the free layer 130''' are thus small, in the range of a few hundred nanometers and preferably less than two hundred nanometers. In addition, some difference is preferably provided between the lateral dimensions to ensure that the free layer 130''' has a particular easy axis in the plane of the free layer 130'''. The thickness of the second free layer 130''' is also preferably small enough that the spin transfer is strong enough to rotate the free layer magnetization into and out of alignment with the magnetization of the pinned layer 110'''. In one embodiment, the free layer 130''' has a thickness of less than five nm.

The pinned layer 110''' includes a nonmagnetic spacer layer 114". The pinned layer 110''' also includes ferromagnetic layers 112" and 118" which are preferably composed of CoFe. However, in an alternate embodiment other ferromagnetic materials and/or alloys might be used. The ferromagnetic layer 112" includes two layers 112A and 112B. These layers are separated by a SPDL 116". The ferromagnetic layers 112" and 118" are spaced apart such that their magnetizations 113" and 119", respectively, are antiferromagnetically aligned. The nonmagnetic spacer layer 114" is conductive and configured such that the magnetizations 113" and 119" of the ferromagnetic layers 112" and 118" are antiferromagnetically aligned. The SPDL 116" is configured to depolarize at least a portion of a plurality of electrons passing through it. Stated differently, the SPDL 116" is configured to randomize the spins of charge carriers (i.e. electrons) traveling through the SPDL 116". Consequently, the thickness, t, of the SPDL 116" is at least on the order of its spin diffusion length. Moreover, the SPDL 116" is configured such that the direct coupling between the ferromagnetic layers 112A and 112B is not substantially adversely affected. As a result, the ferromagnetic layers 112A and 112B are strongly ferromagnetically coupled. In a preferred embodiment, the SPDL 116" includes PtMn, IrMn, CuMn, and/or CuPt. If CuMn is used, the portion of the SPDL 116" including CuMn is preferably two to eight atomic percent Mn. If CuPt is used, the portion of the SPDL 116" including CuPt is preferably two to eight atomic percent Pt. Also in a preferred embodiment, the SPDL 116" is between two and eight Angstroms thick. For a thickness of two through eight Angstroms and the materials listed above, the SPDL 116"

can be deposited such that it is discontinuous. For the above materials, such a thickness is sufficiently large for the SPDL 116" to effectively depolarize the electrons passing through it, and yet small enough so that the ferromagnetic layers 112A and 112B remain strongly ferromagnetically coupled.

With the inclusion of the SPDL 116", the polarization of the spin current passing from the pinned layer to the free layer is determined primarily by the ferromagnetic layer 112A, while the deleterious effects from the ferromagnetic layer. 118" are minimized. Consequently, the spin transfer effect and magnetoresistance ratio are enhanced.

Figure 3D:
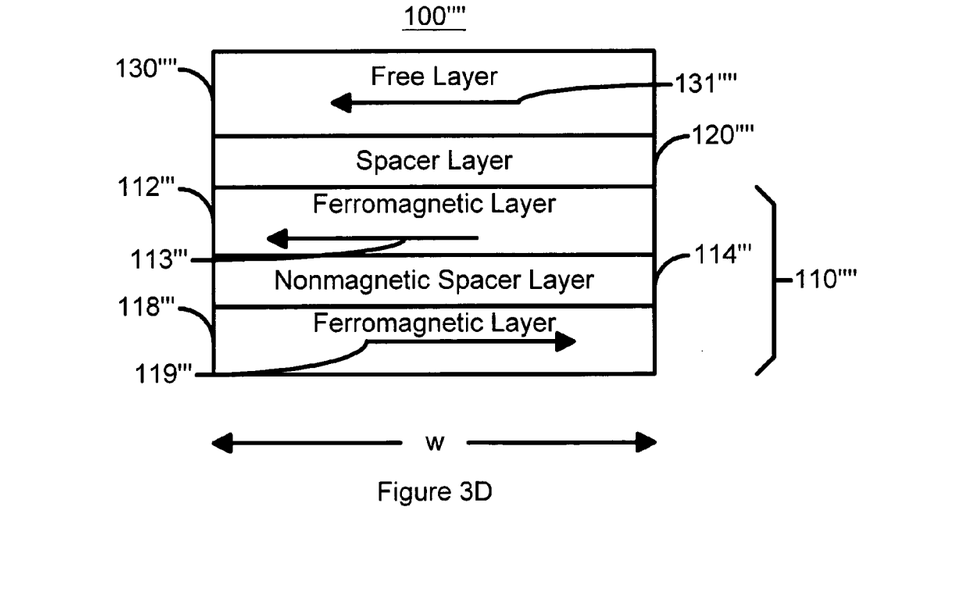
FIG. 3D depicts a fourth embodiment of a portion of a magnetic element in accordance with the present invention having a synthetic antiferromagnetic pinned layer with spin diffusion lengths reduced by doping.

FIG. 3D depicts a fourth embodiment of a portion of a magnetic element 100"" in accordance with the present invention having a synthetic antiferromagnetic pinned layer with a spin depolarization sublayer. The magnetic element 100"" includes a pinned layer 110"", a spacer layer 120"" and a free layer 130"". The spacer layer 120"" and the free layer 130"" correspond to the spacer layer 120 and the free layer 130 depicted in FIG. 2. Referring back to FIG. 3D, the magnetic element 100"" is configured such that the free layer 130"" can be written using spin transfer. Thus, the direction of the magnetization 131"" of the free layer 130"" can be switched using spin transfer. Consequently, in a preferred embodiment, the lateral dimensions, such as the width w, of the free layer 130"" are thus small, in the range of a few hundred nanometers and preferably less than two hundred nanometers. In addition, some difference is preferably provided between the lateral dimensions to ensure that the free layer 130"" has a particular easy axis in the plane of the free layer 130"". The thickness of the second free layer 130"" is also preferably small enough that the spin transfer is strong enough to rotate the free layer magnetization into and out of alignment with the magnetization of the pinned layer 110"". In one embodiment, the free layer 130"" has a thickness of less than five nm.

The pinned layer 110"" includes a nonmagnetic spacer layer 114'''. The pinned layer 110"" also includes ferromagnetic layers 112''' and 118''' which are preferably composed of CoFe. However, in an alternate embodiment other ferromagnetic materials and/or alloys might be used. The pinned layer 110"" is considered to include an SPDL because of the function of the pinned layer 110"". However, as an alternative to inserting at least one SPDL into the pinned layer 110"", the spin diffusion lengths of the ferromagnetic sublayers 112''' and 118 have been reduced to less than the thicknesses of these sublayers 112''' and 118'''. Reduction of the spin diffusion lengths of the ferromagnetic sublayers 112''' and 118''' can be realized through doping these sublayers 112''' and 118''' with appropriate materials, such as Mn.

Figure 4:
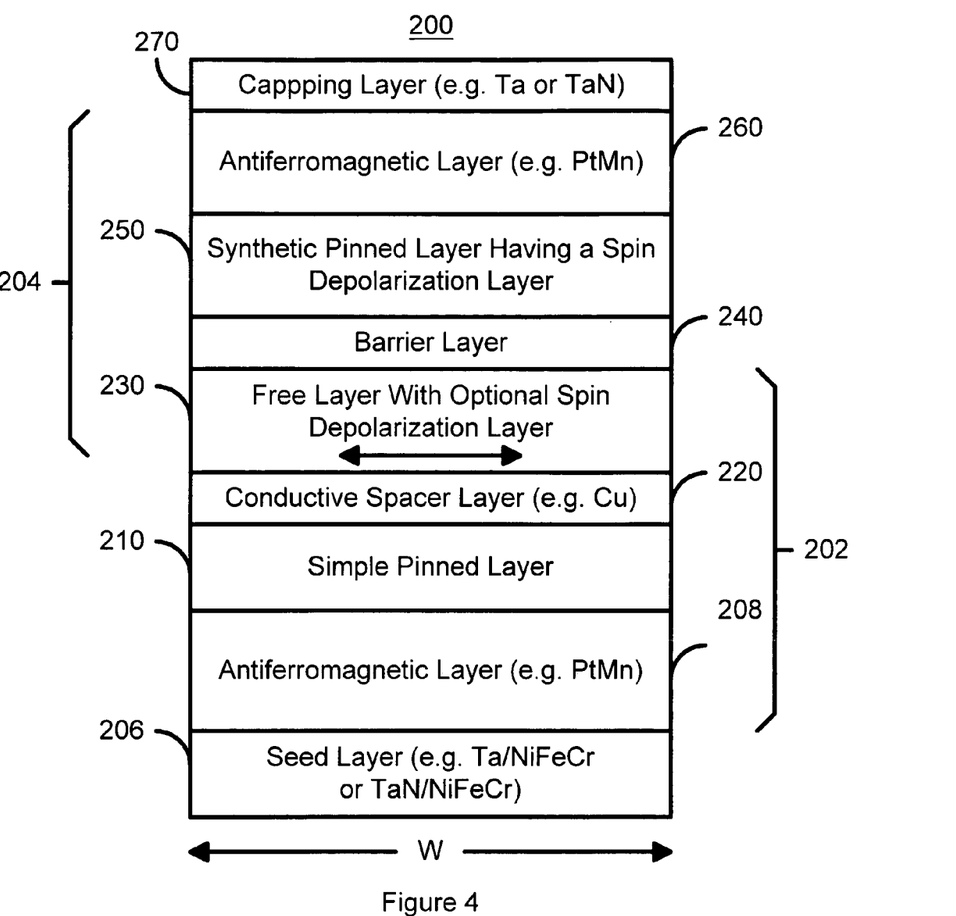
FIG. 4 depicts a first embodiment preferred embodiment of a portion of a magnetic element in accordance with the present invention, a dual spin tunnel/valve structure in accordance with the present invention having at least one synthetic antiferromagnetic pinned layer containing a spin depolarization sublayer.

FIG. 4 depicts a first preferred embodiment of a magnetic element 200 in accordance with the present invention. The magnetic element 200 is a dual spin tunnel/valve structure 200 in accordance with the present invention having a synthetic antiferromagnetic pinned layer with at least one spin depolarization sublayer. The magnetic element 200 thus includes a spin valve portion 202 and a magnetic tunneling junction (MTJ) portion 204 which share a free layer 230. The spin valve portion 202 includes a pinning layer 208 that is preferably an antiferromagnetic (AFM) layer 208. The spin valve portion 202 also includes a pinned layer 210, a conductive spacer layer 220 and a free layer 230. The MTJ portion 204 includes a free layer 230, an insulating barrier layer 240, a pinned layer 250 that is preferably a synthetic antiferromagnetic layer 250, and a pinning layer 260. Also shown is an optional capping layer 270. The AFM layers 208 and 260 are preferably PtMn, but can include other antiferromagnetic materials. Also depicted is a seed layer 206 that is preferably Ta/NiFeCr, TaN/NiFeCr or other material that contributes to a highly textured crystalline film stack. The conductive spacer layer 220 is preferably Cu. The free layer 230 is preferably a simple free layer, but may also be a synthetic free layer. To reduce possible interaction between the pinned layers 210 and 250 on the two sides of the free layer 230 with respect to the polarization of the spin current, at least one optional spin depolarization layer (not explicitly shown) can optionally be inserted within the simple or synthetic free layer 230. In such an embodiment, the free layer 230 would be analogous to the pinned layer 110, 110', 110", 110''', 110'''', or the layer 112" depicted in FIGS. 3A–3D. Referring back to FIG. 4, the magnetic element 200 is configured such that the free layer 230 can be written using spin transfer. Thus, the direction of the magnetization of the free layer 230 can be switched using spin transfer. Consequently, in a preferred embodiment, the lateral dimensions, such as the width w, of the free layer 230 are thus small, in the range of a few hundred nanometers and preferably less than two hundred nanometers. Some difference is preferably provided between the lateral dimensions to ensure that the free layer 230 has a particular easy axis in the plane of the free layer 230. In addition, the thickness of the second free layer 230 may be preferably small enough so that the spin transfer is sufficiently strong to rotate the free layer magnetization into and out of alignment with the magnetization of the pinned layer 210. In one embodiment, the free layer 230 has a thickness of less than five nm.

The pinned layer 210 and/or the pinned layer 250 correspond to the pinned layer 110, 110', 110", or 110'''. In a preferred embodiment, at least the pinned layer 210 corresponds to the pinned layer 110, 101', 110" or 110'''. Consequently, the pinned layer 210 and/or the pinned layer 250 include a SDPL that can depolarize electrons traveling through the SPDL. The pinned layer 250 preferably includes an SPDL analogous to the SPDL 116, 116', or 116"; ferromagnetic layers such as the ferromagnetic layers 112 and 118, 112' and 118', and 112" and 118"; and a nonmagnetic spacer layer such as the nonmagnetic spacer layer 114, 114', and 114".

In operation, the magnetic element 200 is written by using spin transfer. As the magnetizations of the two ferromagnetic sublayers (not shown) in a synthetic structure without an appropriate SPDL insertion are oriented antiparallel, the sublayers produce opposing effects on the spin current passing through them, resulting in a weakened net effect. In contrast, when pinned layer 210 (and/or 250) is synthetic with an appropriate spin depolarization layer insertion, the spin current passing through or reflected from the pinned layer is affected primarily by the ferromagnetic layer lying adjacent to the conductive spacer layer 220 (and/or by the ferromagnetic layer lying adjacent to the barrier layer 240). Because the deleterious effects of the ferromagnetic layers lying away from the conductive spacer layer 220 (and/or from the barrier layer 240) are minimized by the SPDL, the spin transfer torque and magnetoresistance ratio are enhanced.

Figure 5:
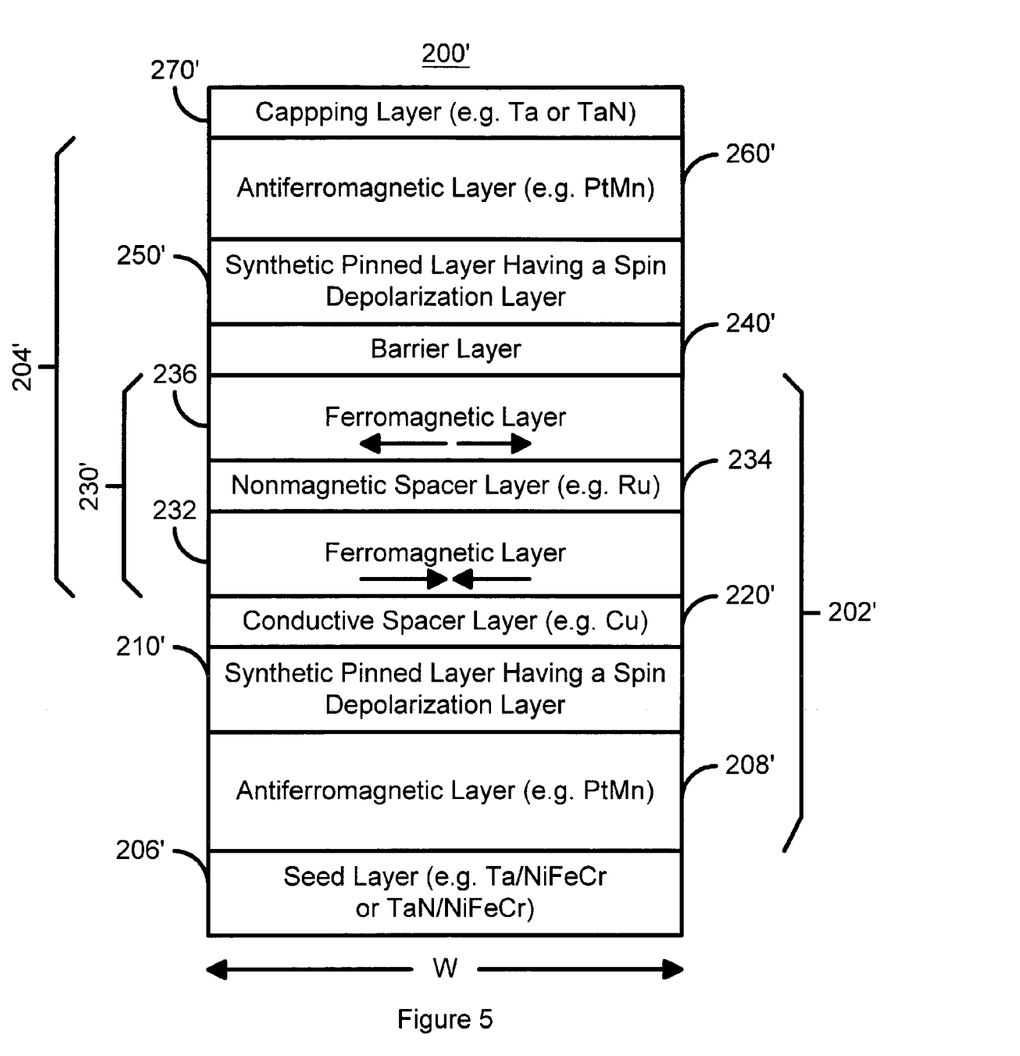
FIG. 5 depicts a second embodiment preferred embodiment of a portion of a magnetic element in accordance with the present invention, another dual spin tunnel/valve structure in accordance with the present invention having synthetic antiferromagnetic pinned layers with spin depolarization sublayers.

FIG. 5 depicts a second embodiment preferred embodiment of a magnetic element 200' in accordance with the present invention. The magnetic element 200' is another dual spin tunnel/valve structure 200' in accordance with the present invention having synthetic antiferromagnetic pinned layers with spin depolarization sublayers. Portions of the dual spin tunnel/valve structure 200' are analogous to the dual spin tunnel/valve structure 200 and are labeled similarly. Thus, the dual spin tunnel/valve structure 200' includes a spin valve portion 202' and an MTJ portion 204'. In addition, the pinned layers 210' and 250', and optionally the free layer 230', include SDPLs such as the layers 110', 110", and 110'". Furthermore, in addition to being configured such that the free layer 230' is switched using spin transfer, the free layer 230' is synthetic, including ferromagnetic layers 232 and 236 separated by a nonmagnetic spacer layer 234. The nonmagnetic spacer layer 234 is preferably Ru and configured such that the magnetizations 233 and 237 of the ferromagnetic layers 232 and 236, respectively, are antiferromagnetically aligned.

In a similar manner as the dual spin tunnel/valve structure 200 and the magnetic element 100, 100', 100", and 100'", the use of pinned layers 210' and 250', and optionally of free layer 230', that are analogous to the layers 110, 110', 110" and/or 110'" in the dual spin tunnel/valve structure 200' mitigates the effects of the ferromagnetic pinned sublayers 210' and 250' that are farthest from the free layer 230'. In addition, when an optional SDPL layer is inserted into the free layer 230', the possible interaction between the pinned layers on the two sides of the free layer 230' with respect to the spin current is minimized. Consequently, performance of the dual spin tunnel/valve structure 200 is improved.

Figure 6:
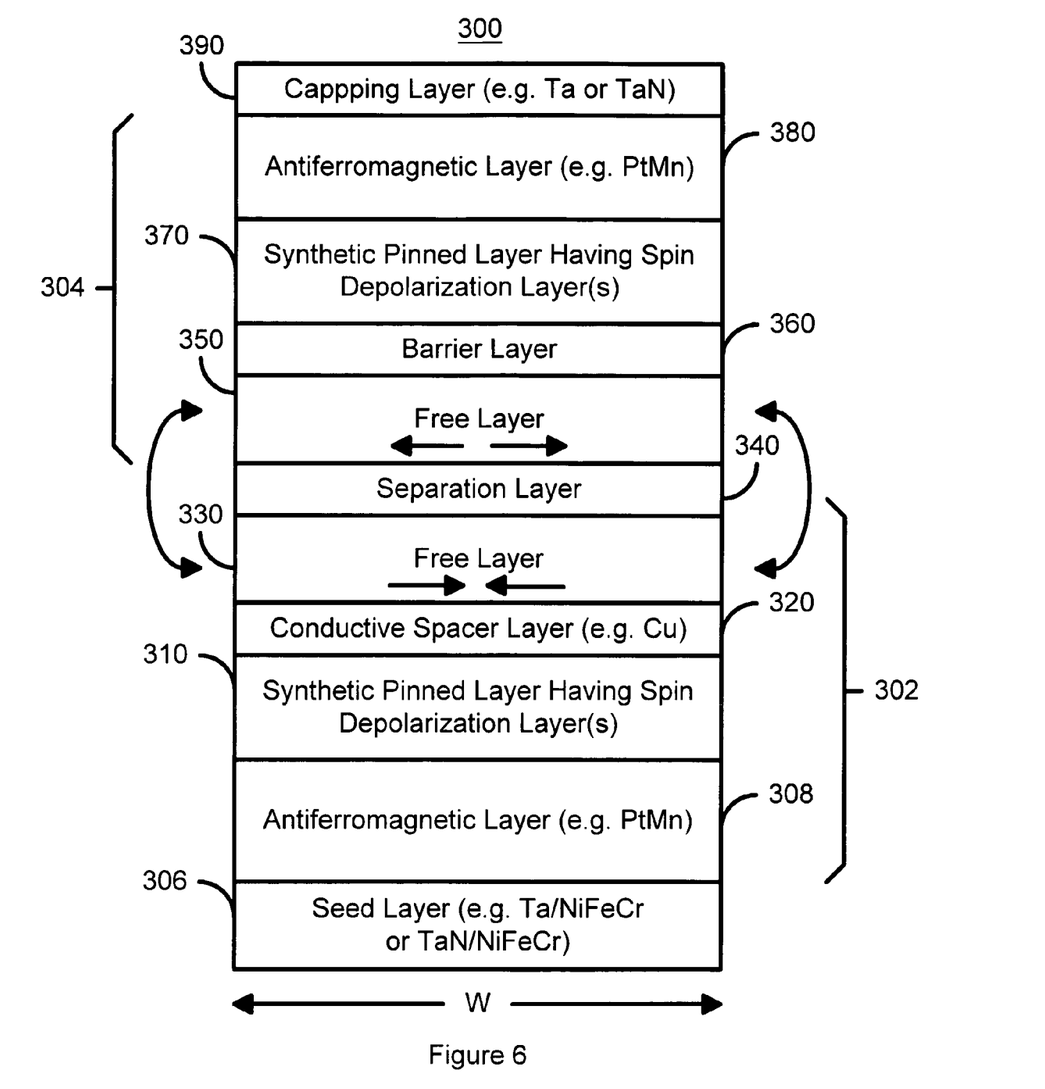
FIG. 6 depicts a third embodiment preferred of a portion of a magnetic element in accordance with the present invention having synthetic antiferromagnetic pinned layers with spin depolarization sublayers.

FIG. 6 depicts a third embodiment preferred of a magnetic element 300 in accordance with the present invention having synthetic antiferromagnetic pinned layers with spin depolarization sublayers. The magnetic element 300 includes two magnetic elements, at least one of which is analogous to the magnetic element 100, 100', 100", or 100'". The magnetic element 300 includes a spin valve 302 and a MTJ 304. Also shown are a seed layer 306 and a capping layer 390. The seed layer 306 is preferably Ta/NiFeCr, TaN/NiFeCr, or other material that contributes to a highly textured crystalline film. The capping layer 390 is preferably Ta or TaN. The spin valve 302 includes an AFM layer 308, a pinned layer 310, a spacer layer 320 that is conductive, and a free layer 330. The AFM layer 308 preferably includes PtMn, but may also include other AFM materials. The free layer 330 is ferromagnetic and may include Co, Fe, Ni or their alloys, such as CoFe, CoNi, CoFeNi and NiFe. Alternatively, the free layer 330 may be synthetic.

The MTJ 304 includes a second free layer 350, an insulating barrier layer 360, a second pinned layer 370, and a second pining layer 380 that is preferably also an AFM layer 380. The second AFM layer 380 preferably includes PtMn, but may also include other AFM materials. The second free layer 350 is ferromagnetic. The second free layer 350 is preferably a simple free layer, but may be synthetic. Also shown is the capping layer 390 that is preferably Ta or TaN.

The MTJ 304 and the spin valve 302 are configured such that the free layers 330 and 350 are magnetostatically coupled. This generally means that the free layers 330 and 350 are separated by a distance such that they are magnetostatically, and preferably antiferromagnetically, coupled. In a preferred embodiment, this configuration is achieved through the use of a separation layer 340. The separation layer 340 is preferably a nonmagnetic conductive layer. Thus, the separation layer 340 can include materials such as Cu, Au or Ag. The separation layer is thick enough to preclude interlayer exchange coupling of the free layers 330 and 350. This thickness is preferably at least one hundred to two hundred Angstroms. The separation layer 340 also preferably substantially reduces or eliminates the spin transfer due to electrons reflected from the interface of the separation layer 340 and the free layer 330 or 350. In order to do so, materials having a short spin diffusion length can be used or inserted into the separation layer 340. For example, the separation layer 340 could be composed of a material such as CuPt or CuMn. Alternatively, the separation layer 340 could be a multilayer including one or more layers of material such as CuPt or CuMn. For example, the separation layer 106 could include a trilayer composed of a layer of CuPt sandwiched between two Cu layers. The separation layer 340 could also include Pt and/or Mn. Furthermore, the separation layer 340 has a thickness that allows for magnetostatic coupling between the free layer 330 and the free layer 350. In a preferred embodiment, the free layer 330 and the free layer 350 are magnetostatically coupled to be antiparallel, as shown in FIG. 6. For example, when the magnetic element 300 is an ellipsoid of 0.1×0.2 $\mu m^2$, the free layer 330 and the free layer 350 are magnetostatically coupled due to edge magnetic poles and are, therefore, antiparallel. However, in an alternate embodiment, the directions of the magnetizations of the free layers 330 and 350 could be coupled in another direction with respect to each other.

The magnetic element 300 is configured to allow the magnetization of at least the free layer 330 to be switched using spin transfer. Consequently, the dimensions of the magnetic element 300 are small, in the range of few hundred nanometers. In a preferred embodiment, the dimensions of the magnetic element 300 are less than two hundred nanometers and preferably approximately one hundred nanometers. The magnetic element 300 may have a depth, perpendicular to the plane of the page in FIG. 5, of approximately fifty nanometers. The depth is preferably smaller than the width of the magnetic element 300 so that the magnetic element 300 has some shape anisotropy, ensuring that the free layer 330 has a preferred direction. In addition, the thickness of the free layer 330 may be small enough that the spin transfer is sufficiently strong to rotate the free layer magnetization into and out of alignment with the magnetization of the pinned layer 310. In one embodiment, the free layer 330 has a thickness of less than five nm.

The pinned layer 310 and the pinned layer 370 include at least one SPDL each. The pinned layer 310 and the pinned layer 370 thus preferably correspond to the pinned layer 110, 110', 110", and/or 110'". Consequently, the pinned layer 310 and the pinned layer 370 include SDPLs such as the SPDL 116, 116', or 116"; ferromagnetic layers such as the ferromagnetic layers 112 and 118, 112' and 118', and 112" and 118"; and nonmagnetic spacer layers such as the nonmagnetic spacer layer 114, 114', and 114". In operation, the magnetic element 300 is written by driving current in a CPP configuration and exploiting spin transfer. When current is driven in a direction from the spin tunneling junction 304 to the spin valve 302, the direction of magnetization of the free layer 330 is switched to be parallel to the magnetization of the ferromagnetic layer of the pinned layer 310 that is closest to the free layer 330. Because of the magnetostatic coupling between the free layers 310 and 350, the magnetization direction of the free layer 350 is also switched. Similarly, when current is driven from the spin valve 302 to the spin tunneling junction 304, the direction of magnetization of the free layer 330 is switched to be antiparallel to the magnetization of the ferromagnetic layer of the pinned layer 310 that is closest to the free layer 330. Because of the magnetostatic coupling between the free layers 310 and 350, the magnetization direction of the free layer 350 is also switched. In this case, the presence of the SDPL such as the SDPL 116, 116' and 116" in the pinned layer 310 that is configured as the pinned layers 110', 110", and 110'", respectively, mitigates the effects of the ferromagnetic layer of the pinned layer 310 that is farthest from the free layer 330. Consequently, when current is driven up in FIG. 6, the magnetization of the free layer 330 is more easily switched using spin transfer. Due to magnetostatic coupling, switching of the free layer 330 leads to switching of the free layer 350, which also experiences its own spin transfer torque coming from the pinned layer 370. In a similar manner, use of an SDPL such as the SDPL 116, 116', and 116" in the pinned layer 370 of the MTJ 304 improves the ability of the MTJ 304 to exhibit spin transfer induced switching of the free layer 350. Consequently, performance of the magnetic element 300 can be improved.

Thus, using pinned layers 110, 110', 110", 110''', 210 and/or 250, 210' and/or 250', 310 and/or 370 having SPDL such as the SPDL 116, 116', and/or 116", for example placed as depicted in FIGS. 3A, 3B, and 3C, spin transfer induced switching can be improved.

A method and system has been disclosed for providing an improved magnetic element that can be written using spin transfer. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic element comprising:
   a free layer being ferromagnetic and having a free layer magnetization;
   a spacer layer, the spacer layer being nonmagnetic; and
   a pinned layer, the spacer layer residing between the pinned layer and the free layer, the pinned layer including a first ferromagnetic layer having a first magnetization, a second ferromagnetic layer having a second magnetization, a nonmagnetic spacer layer, and a spin depolarization layer, the nonmagnetic spacer layer being conductive and residing between the first ferromagnetic layer and the second ferromagnetic layer such that the first magnetization and the second magnetization are antiparallel, the spin depolarization layer being configured to depolarize at least a portion of a plurality of electrons passing through the spin depolarization layer;
   wherein the magnetic element is configured to allow the free layer magnetization to change direction due to spin transfer when a write current is passed through the magnetic element.

2. The magnetic element of claim 1 wherein the spin depolarization layer further includes PtMn, Mn, Pt, IrMn, CuMn, and/or CuPt.

3. The magnetic element of claim 2 wherein the CuMn includes two to eight atomic percent of Mn.

4. The magnetic element of claim 2 wherein the CuPt includes two to eight atomic percent of Pt.

5. The magnetic element of claim 1 wherein the spin depolarization layer has a thickness of between two and eight Angstroms.

6. The magnetic element of claim 1 wherein the spin depolarization layer resides between the nonmagnetic spacer layer and the second ferromagnetic layer, the first ferromagnetic layer being closer to the free layer than the second ferromagnetic layer.

7. The magnetic element of claim 1 wherein the spin depolarization layer resides between the nonmagnetic spacer layer and the first ferromagnetic layer, the first ferromagnetic layer being closer to the free layer than the second ferromagnetic layer.

8. The magnetic element of claim 1 wherein the spin depolarization layer resides within the first ferromagnetic layer, the first ferromagnetic layer being closer to the free layer than the second ferromagnetic layer.

9. The magnetic element of claim 1 wherein the spacer layer is conductive and wherein the magnetic element further includes:
   a barrier layer, the barrier layer being an insulator and having a thickness that allows tunneling through the barrier layer;
   a second pinned layer, the barrier layer being between the free layer and the second pinned layer, the second pinned layer being ferromagnetic.

10. The magnetic element of claim 9 wherein the first ferromagnetic layer is closer to the free layer than the second ferromagnetic layer, wherein the second pinned layer has a third magnetization antiparallel to the first magnetization.

11. The magnetic element of claim 9 wherein the second pinned layer includes a third ferromagnetic layer having a third magnetization, a fourth ferromagnetic layer having a fourth magnetization, and a second nonmagnetic spacer layer, the second nonmagnetic spacer layer being conductive and configured such that the third magnetization is antiparallel to the fourth magnetization and wherein the free layer further includes a fifth ferromagnetic layer having a fifth magnetization, a third nonmagnetic spacer layer, and a sixth ferromagnetic layer having a sixth magnetization, the third nonmagnetic spacer layer residing between the fifth ferromagnetic layer and the sixth ferromagnetic layer, the fifth magnetization being antiparallel to the sixth magnetization.

12. The magnetic element of claim 11 wherein the third magnetization is parallel to the first magnetization, wherein the first ferromagnetic layer is closer to the free layer than the second ferromagnetic layer, and wherein the third ferromagnetic layer is closer to the free layer than the fourth ferromagnetic layer.

13. The magnetic element of claim 11 wherein the second pinned layer further includes a second spin depolarization layer, the second spin depolarization layer being configured to depolarize at least a second portion of the plurality of electrons passing through the second spin depolarization layer.

14. The magnetic element of claim 1 wherein the free layer further includes a second spin depolarization layer.

15. The magnetic element of claim 1 wherein the free layer is a synthetic free layer including a second spin depolarization layer.

16. The magnetic element of claim 1 further comprising:
   a second pinned layer, the second pinned layer being ferromagnetic;
   a second spacer layer;
   a second free layer, the second spacer layer being between the second free layer and the second pinned layer, the second free layer having a second free layer magnetization, the second free layer magnetization being magnetostatically coupled with the free layer magnetization.

17. The magnetic element of claim 16 further comprising:
   a separation layer configured such that the second free layer magnetization is magnetostatically coupled with the free layer magnetization.

18. The magnetic element of claim 16 wherein the spacer layer is conductive and the second spacer layer is an insulating barrier layer.

19. The magnetic element of claim 16 wherein the second pinned layer includes a third ferromagnetic layer having a third magnetization, a fourth ferromagnetic layer having a fourth magnetization, and a second nonmagnetic spacer layer between the third ferromagnetic layer and the fourth ferromagnetic layer, the second nonmagnetic spacer layer being conductive and configured such that the third magnetization is antiparallel to the fourth magnetization.

20. The magnetic element of claim 16 wherein the second pinned layer further includes a second spin depolarization layer, the second spin depolarization layer being configured to depolarize at least a second portion of the plurality of electrons passing through it the second spin depolarization layer.

21. A magnetic element comprising:
- a free layer being ferromagnetic and having a free layer magnetization;
- a spacer layer, the spacer layer being nonmagnetic; and
- a pinned layer, the spacer layer residing between the pinned layer and the free layer, the pinned layer including a first ferromagnetic layer having a first magnetization, a second ferromagnetic layer having a second magnetization, and a nonmagnetic spacer layer, the nonmagnetic spacer layer being conductive and residing between the first ferromagnetic layer and the second ferromagnetic layer such that the first magnetization and the second magnetization are antiparallel, the first ferromagnetic layer ferromagnetic layer having a first thickness and being doped with at least a first material such that a first spin diffusion length of the first ferromagnetic layer is reduced to be less than the first thickness, the second ferromagnetic layer being doped with at least a second material such that a second spin diffusion length of the second ferromagnetic layer is reduced;

wherein the magnetic element is configured to allow the free layer magnetization to change direction due to spin transfer when a write current is passed through the magnetic element.

* * * * *